United States Patent [19]

Neckers et al.

[11] Patent Number: 5,137,800
[45] Date of Patent: Aug. 11, 1992

[54] PRODUCTION OF THREE DIMENSIONAL BODIES BY PHOTOPOLYMERIZATION

[75] Inventors: Douglas C. Neckers, Perrysburg; Oscar Valdes-Aguilera, Bowling Green, both of Ohio; Krishan S. Raghuveer, Bartlesville, Okla.; Darrell G. Watson, Flint, Mich.

[73] Assignee: StereoGraphics Limited Partnership, Maumee, Ohio

[21] Appl. No.: 537,448

[22] Filed: Jun. 14, 1990

Related U.S. Application Data

[63] Continuation-in-part of Ser. No. 348,069, filed as PCT/US90/00991, Feb. 23, 1990, abandoned, which is a continuation-in-part of Ser. No. 315,383, Feb. 24, 1989, abandoned.

[51] Int. Cl.$^5$ .............. G03C 1/725; C08F 2/46
[52] U.S. Cl. .................... 430/281; 430/293; 430/270; 430/30; 522/13; 522/14; 522/16; 522/24; 522/26; 522/913
[58] Field of Search .............. 430/281, 293, 270, 30; 522/14, 16, 26, 913, 13, 24

[56] References Cited

U.S. PATENT DOCUMENTS

| | | | |
|---|---|---|---|
| 2,760,863 | 8/1956 | Plambeck, Jr. | 95/5.6 |
| 2,875,047 | 2/1959 | Oster | 96/35 |
| 3,203,332 | 8/1965 | Deile et al. | 95/73 |
| 3,244,518 | 4/1966 | Schwerin et al. | 96/2 |
| 3,917,794 | 11/1975 | Akagi et al. | 427/68 |
| 4,222,835 | 9/1980 | Dixon | 204/159 |
| 4,376,158 | 3/1983 | Spechler | 430/291 |
| 4,552,830 | 11/1985 | Reardon et al. | 430/281 |
| 4,561,951 | 12/1985 | Neckers | 522/33 |
| 4,654,378 | 3/1987 | Hunter et al. | 522/3 |
| 4,716,097 | 12/1987 | Weed | 430/327 |
| 4,772,530 | 9/1988 | Gottschalk et al. | 430/138 |
| 4,816,379 | 3/1989 | Bronstert et al. | 430/306 |

OTHER PUBLICATIONS

Kosar, Light Sensitive Systems, J. Kosar, John Wiley and Sons, Inc., pp. 158–160, 1965.

*Primary Examiner*—Marion E. McCamish
*Assistant Examiner*—Mark A. Chapman
*Attorney, Agent, or Firm*—Thompson, Hine and Flory

[57] ABSTRACT

A polymerizable composition and a method are disclosed. The composition includes a photopolymerizable monomer and a photoinitiator system for the monomer. The system, in one embodiment, is one wherein a ray of activating radiation which enters a body of the composition through a surface thereof activates the photoinitiator system and causes polymerization at each of a succession of points, the first such point being immediately adjacent the surface and subsequent points being successively farther from the surface in the direction of travel of the ray of activating radiation, the distance from the surface to the point of the succession farthest therefrom varying as a function of at least one of (a) the intensity of the activating radiation and
(b) the time during which the activating radiation enters the body through the surface.

The method involves the steps of directing a ray of activating radiation for the photoinitiator system to and through a point in a given plane and into a body of the composition, and controlling at least one of (c) the intensity of the activating radiation of the ray and
(d) the time during which the ray entering the body is directed through the point to determine the distance from a surface through which the ray of activating radiation enters the body to the point of the succession of points to which the ray activates the photoinitiator system that is farthest from the surface.

17 Claims, 4 Drawing Sheets

PRODUCTION OF THREE DIMENSIONAL BODIES BY PHOTOPOLYMERIZATION

REFERENCE TO RELATED APPLICATIONS

This is a continuation-in-part of PCT/US90/00991, filed Feb. 23, 1990, claiming Convention Priority based upon U.S. application Ser. No. 348,069, filed May 15, 1989, and upon U.S. application Ser. No. 315,383, filed Feb. 24, 1989. This is also a continuation-in-part of said application Ser. No. 348,069 and a continuation-in-part of said application Ser. No. 315,383, both now abandoned.

DEFINITIONS

As used herein, and in the appended claims, unless the contrary is indicated, the terms percent and parts refer to percent and parts by weight, all temperatures are in °C., and the following terms have the meanings stated: nm means nanometer or nanometers; g means gram or grams; kg means kilogram or kilograms; ray, as applied to activating radiation for a photoinitiator refers to such radiation which has negligible dimensions at right angles to its direction of travel; cm means centimeter or centimeters; $\mu$m means micrometer or micrometers; mm means millimeter or millimeters; L means liter or liters; mL means milliliter or milliliters; m means gram mole or gram moles; mgm means milligram mole or milligram moles; $m/o$ means mole percent, and equals 100 times the number of moles of the constituent designated in a composition divided by the total number of moles in the composition; s means second or seconds; ms means millisecond or milliseconds; $\mu$s means microsecond or microseconds; mW means milliwatt or milliwatts; psi means pounds per square inch; and MPa means $10^6$ Pascals.

BACKGROUND OF THE INVENTION

1. Field of the Invention

This invention relates to a family of new photoinitiators, to new compositions comprising a free-radical addition polymerizable or crosslinkable compound and a photoinitiator system for the compound which includes a xanthene dye derivative, and to a method for producing three dimensional and other bodies by photopolymerization of the fluid monomer, and, more particularly, to such a method in which a laser is used to provide activating radiation for the photoinitiator system for the monomer. The invention also relates to a method for producing a three-dimensional model of an internal organ of a human or of a lower animal.

2. The Prior Art

Broadly speaking, a body of a composition comprising a photopolymerizable monomer, usually an acrylate or an acrylate derivative, and a photoinitiator system therefor can be caused to undergo photopolymerization by subjecting it to activating radiation of a suitable wave length. The photoinitiator system includes a compound, called a "photoinitiator", and, usually, an "accelerator". Activating radiation causes the photoinitiator to undergo a reaction, producing an intermediate which includes a free radical chain and, as a consequence, causes the monomer to polymerize. The accelerator, frequently a tertiary amine or a borate which, among other things, acts to ameliorate the effect of oxygen, which is to terminate the free radical chains that are produced by the reaction of the photoinitiator and, as a consequence, to quench the free radical polymerization.

Most photopolymerizations are carried out to polymerize monomers in relatively thin films, for example, to "dry" printing ink after it has been applied to paper, or to cure solventless varnishes, adhesives and photoresists. Indeed, U.S. Pat. No. 4,575,330 granted Mar. 11, 1986 to Hull, "The 3-D Patent", discloses a method for producing three dimensional articles by a process which involves a plurality of photopolymerizations, one to form each of a large number of thin films which ultimately make up the desired article.

Most photoinitiators that have been used commercially are activated by ultraviolet radiation, i.e., radiation having a wavelength shorter than 400 nm, and usually from mercury lamps, for example mercury resonance lamps with output at 313 nm and 364 nm. An ultraviolet laser is used in the process disclosed by The 3-D Patent, but such a laser, at the present time, has some limitations. It is not reliable, has a short lifetime, is expensive and has a high power requirement. Recently, photoinitiators that are activated by visible light have also been used, notably in a colored copying process that is available under the trade designation "CYCOLOR". Benzoin ethers and related acetals, Hammond's initiators, diaryliodonium and triaryl sulfonium salts and various photosensitive peroxides and peresters are examples of known photoinitiators that are activated by ultraviolet radiation (see, for example, U.S. Pat. No. 4,561,951, "Neckers", granted Dec. 31, 1985 to one of the present inventors). Cyanine dye, borate-so-called(+,−) ion pair initiators, xanthene dyes, and onium salt (−,+) ion pair photoinitiators are examples of known photoinitiators that are activated by radiation in the visible spectrum. The properties of polymers produced when these photoinitiators are used, however, are inferior to those of polymers produced when the photoinitiators are activated by ultraviolet radiation.

BRIEF DESCRIPTION OF THE INSTANT INVENTION

The instant invention is based upon the discovery of a composition that is comprised of a photopolymerizable monomer and a photoinitiator system therefor. The system is one wherein a ray of activating radiation which enters the body through a surface thereof activates the photoinitiator system and causes polymerization at each of a succession of points, the first such point being immediately adjacent the surface and subsequent points being successively farther from the surface in the direction of travel of the ray of activating radiation; the distance from the surface to the point of the succession farthest therefrom varies as a function of at least one of (a) the intensity of the activating radiation, and (b) the time during which the activating radiation enters the body through the surface.

Trimethylolpropane triacrylate with 0.06 g eosin lactone and 15 g triethanolamine per kg triacrylate dissolved therein is an example of such a composition. When a beam of visible light from an argon ion laser having a wavelength of 514 nm passes through the composition, the eosin undergoes a reaction with the triethanol-amine, producing two moieties, one of which is a free radical which serves as an activator for the polymerization of the trimethylolpropane triacrylate. Loss of the dye color also occurs as a consequence of the eosin reaction with the triethanol amine, enabling subsequent radiation from the argon ion laser to penetrate farther into the composition and to cause reaction of eosin with triethanol amine and activation of the trimethylolpropane triacrylate at the level of greater penetration, and still greater penetration by subsequent radiation with consequent reaction and activation at the level of the still greater penetration.

The invention is also based upon the discovery that such photoinitiators as eosin lactone, methylene violet, methylene blue, methylene green, ethyl eosin ester, RB lactone, ethyl RB, RB peroxide and erythrosin, usually in the presence of an accelerator such as triethanolamine, can be used in comparatively high concentrations with a photopolymerizable monomer to produce a composition wherein a high intensity ray of activating radiation in the visible or infra red spectrum will cause polymerization to a desired extent in a short period of time.

The invention, in one aspect, is a method which comprises the steps of directing a ray of activating radiation for the photoinitiator system to and through a point in a given plane and into a body of the foregoing trimethylolpropane triacrylate composition, or an equivalent, and controlling at least one of (c) the intensity of the activating radiation of the ray and (d) the time during which the ray entering the body is directed through the point to determine the distance from a surface through which the ray of activating radiation enters the body to the point of the succession of point to which the ray activates the photoinitiator system that is farthest from the surface.

In another aspect, the invention involves a method for polymerizing a body of a composition comprised of a photopolymerizable monomer and a photoinitiator system for the monomer which system includes any one of a number of dyes which are broadly classified as xanthene, thionine, cyanine, stryllium ion, pyrrilium salt, oxazone, azinium ion, and triphenylmethane dyes. The photoinitiator system for the monomer includes one of the following, for example: eosin lactone, methylene violet, methylene blue, methylene green, ethyl eosin ester, eosin ester, RB lactone, ethyl RB, RB peroxide, eosin peroxide or erythrosin. The photopolymerization is carried out by directing a visible or infra red spectrum ray of activating radiation for the photoinitiator system into the body, and controlling the intensity of the activating radiation so that the desired extent of polymerization occurs in an acceptable time. The visible or infra red spectrum ray has a wavelength of from 400 to 1000 nm.

In still another aspect, the invention is a photochemical method for applying a polymeric coating to a metal, glass, or other substrate, or for welding, laminating or sealing two bodies, at least one of which is transparent, to one another.

In yet another aspect, the invention is a method for initiating photopolymerization with an inexpensive diode laser, for example one which emits radiation having a wavelength of 682 nm.

In a still further aspect, the invention is a photopolymerizable composition which contains a xanthene dye derivative having a Y2' substituent which makes the derivative more soluble than the dye in the composition. Preferably, the xanthene dye derivative has the structure of FIG. 1 of the attached drawings.

In still another aspect the invention is a method for photo-polymerizing which involves the use, as an activator, of a xanthene dye derivative having a Y2' substituent which makes the derivative more soluble than the dye in the composition. Preferably, the xanthene dye derivative has the structure of FIG. 1 of the attached drawings.

In yet another aspect, the invention is a photopolymerizable composition which contains one of a family of dyes or derivatives which have the structure of FIGS. 2, 3, 4 or 5 of the attached drawings.

In still another aspect the invention is a method for photopolymerizing which involves the use of dye or dye derivative having the structure of FIGS. 2, 3, 4 or 5 of the attached drawings as an initiator.

In yet a further embodiment, the invention is a method for producing a model of an interior organ, bone or the like of an animal. The method involves the steps of successively subjecting a body of a photopolymerizable composition to initiating energy in a succession of X,Y planes extending from one surface to an opposed surface of the model in the regions where an MRI Scan, a CAT Scan, a Sonnographic Scan, or the like indicate that the desired model requires solid material. The number of X,Y planes is sufficiently large that bodies of polymerized material that are formed by polymerization of the composition in each of the X,Y planes, and that are thin in the Z dimension, constitute the model of the organ, bone or the like. Most desirably, the photopolymerizable composition contains as initiator which is activated by visible light, and visible light is used to initiate photopolymerization.

DESCRIPTION OF THE PREFERRED EMBODIMENTS

Figure 1:
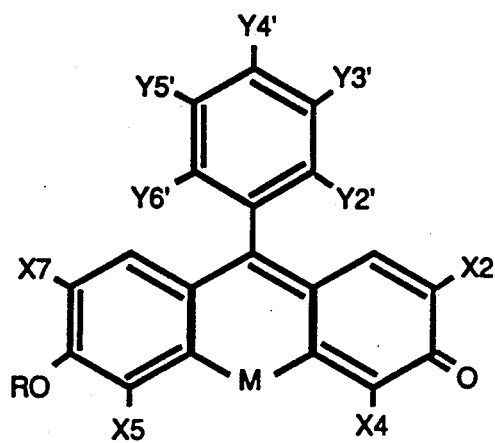
FIG. 1 is a structural formula for a family of xanthene dye derivatives which are initiators in photopolymerizable compositions according to the invention.

The following examples are presented solely for the purpose of further illustrating and disclosing the invention and are not to be construed as limiting.

EXAMPLE 1

A photopolymerizable composition prepared by mixing trimethylolpropane triacrylate with 0.0669 g eosin lactone and 16 g triethanolamine, per kg triacrylate, was placed in a glass vessel that was square in horizontal cross section, each side of the square being substantially 1 cm in length. A shutter was then positioned closely adjacent one of the walls of the vessel, and a beam of light having a wavelength of 514 nm was directed from an argon ion laser toward the shutter and one of the walls of the vessel. The shutter was so positioned that, when closed, it prevented light from the laser from impinging on the vessel and, when open, a beam of light that was circular in cross section and had a radius substantially less than 1 mm traveled through one of the glass walls of the vessel, at substantially a right angle thereto, and into the photopolymerizable composition.

In a first series of photopolymerizations, the shutter was opened for 125 ms while the laser was set to deliver a light beam which had a power varying from 25 to 250 mW, and the position of the glass vessel was changed after each shutter opening, so that different parts of the photopolymerizable composition were activated by light having a wavelength of 514 nm and of diverging intensities. The depth to which photopolymerization occurred at each of four intensities is shown in the following table:

| Power, mW | Depth of photopolymerization, mm |
| --- | --- |
| 250 | 5.40 |
| 100 | 2.06 |
| 50 | 1.25 |
| 25 | 0.60 |

In a second series of photopolymerizations, a similar procedure was used, except that the shutter was opened for 66.7 ms. The depth to which photopolymerization occurred at each of four intensities is shown in the following table:

| Power, mW | Depth of photopolymerization, mm |
| --- | --- |
| 250 | 3.60 |
| 100 | 1.01 |
| 50 | 0.66 |
| 25 | thin film |

In a third series of photopolymerizations, a similar procedure was used, except that the power was kept constant, the shutter was opened for different periods of time, and the photopolymerizable composition was composed of trimethylolpropane triacrylate containing 0.0596 g eosin lactone and 7.38 g triethanolamine, per kg triacrylate. The depth to which photopolymerization occurred at a power of 250 mW and at each of eight different exposure times is shown in the following table:

| Exposure time, ms | Depth of photopolymerization, mm |
| --- | --- |
| 8 | 0.61 |
| 16.7 | 1.2 |
| 33.3 | 1.76 |
| 66.7 | 3.06 |
| 125 | 5.24 |
| 250 | 6.67 |
| 500 | 8.05 |
| 1000 | >10.0 |

It will be appreciated that the foregoing data show depth of polymerization to be a direct function of exposure time when the power is constant, and of power when exposure time is constant. This phenomenon is sometimes called "reciprocity".

The trimethylolpropane triacrylate used as described above in Example 1 (hereafter "Monomer 1") is one that is available commercially under the trade designation "Sun Printing Ink 1622-53-1". It contains about 94 percent of trimethylolpropane triacrylate and minor amounts of various modifiers.

The laser used as described above in Example 1 was one that is commercially available under the trade designation "Spectra Physics argon ion laser Model 2016-05". As indicated above, it was tuned to emit light having a wavelength of 514 nm.

EXAMPLE 2

A photopolymerizable composition composed of Monomer 1, 0.26 g methylene violet and 16.4 g triethanolamine, per kg of the monomer, was photopolymerized as described in Example 1, using a helium/neon laser which emitted light at 632 nm and of 15.83 mW power, and various activating times. The depth to which photopolymerization occurred at each of three different exposure times is shown in the following table:

| Exposure time, ms | Depth of photopolymerization, mm |
| --- | --- |
| 500 | 4.27 |
| 250 | 1.85 |
| 125 | 0.25 |

Distortion was observed in the polymer when an activating time of 1000 ms was used.

In a second series of photopolymerizations, a similar procedure was used, except that the photopolymerizable composition was composed of Monomer 1 containing 0.27 methylene violet and 40.1 g triethanolamine, per kg of the monomer. The depth to which photopolymerization occurred at each of seven different exposure times is shown in the following table:

| Exposure time, ms | Depth of photopolymerization, mm |
| --- | --- |
| 8 | thin film |
| 16.7 | 0.38 |
| 33.0 | 0.37 |
| 125 | 1.61 |
| 250 | 2.85 |
| 500 | 6.55 |
| 1000 | 6.55 |

The helium/neon laser (hereafter "Laser 2") used as described above in Example 2 is commerically available under the trade designation "Nelles-Griot He/Ne Laser". As used in the present Examples it emits light having a wavelength of 632 nm, 15.83 nW.

EXAMPLE 3

A photaopolymerizable composition composed of Monomer 1, 0.037 g methylene blue and 38.839 g triethanolamine, per kg of the monomer, was photopolymerized as described in Example 1 using Laser 2, and various activating times. The depth to which photopolymerization occurred at each of three different exposure times is shown in the following table:

| Exposure time, ms | Depth of photopolymerization, mm |
|---|---|
| 1000 | >10 |
| 500 | 7.74 |
| 250 | 4.57 |
| 125 | 2.36 |

The data were divergent and not reliable when an activating time of 66.7 ms or less was used.

In a second series of photopolymerizations, a similar procedure was used, except that the photopolymerizable composition was composed of Monomer 1 containing 0.03689 g methylene blue and 14.38 g triethanolamine, per kg of the monomer. The depth to which photopolymerization occurred at each of four different exposure times is shown in the following table:

| Exposure time, ms | Depth of photopolymerization, mm |
|---|---|
| 125 | 1.44 |
| 250 | 2.81 |
| 500 | 5.68 |
| 1000 | >7.6 |

Activating times shorter than 125 ms did not produce reliable results.

EXAMPLE 4

A photopolymerizable composition composed of Monomer 1, 0.358 g methylene green and 36.47 g triethanolamine, per kg of the monomer, was photopolymerized as described in Example 1, using Laser 2, and various activating times. The depth to which photopolymerization occurred at each of six different exposure times is shown in the following table:

| Exposure time, ms | Depth of photopolymerization, mm |
|---|---|
| 16.66 | 0.189 |
| 33.33 | 0.640 |
| 66.67 | 0.643 |
| 125 | 1.132 |
| 250 | 2.459 |
| 250 | 2.459 |
| 500 | 2.980 |

Activating times shorter than 66.67 ms did not always give reproducible results.

In a second series of photopolymerizations, a similar procedure was used, except that the photopolymerizable composition was composed of Monoomer 1 containing 0.36 g methylene green and 17.9 g triethanolamine, per kg of the monomer. The depth to which photopolymerization occurred at each of four different exposure times is shown in the following table:

| Exposure time, ms | Depth of photopolymerization, mm |
|---|---|
| 33.33 | 0.758 |
| 66.67 | 0.801 |
| 125 | 1.147 |
| 250 | 2.642 |

Activating times shorter than 66.67 ms did not always give reproducible results.

A photopolymerizable composition composed of Monomer 1 containing 0.036 g methylene green and 17.9 g triethanolamine, per kg of the monomer, was found to have a long induction period, polymerization being initiated only at flash periods greater than 500 ms.

EXAMPLES 5–22

Several photopolymerizations have been carried out using various photoinitiator systems in a monomer system composed of 1 g vinyl 2-pyrollidone and 9 g dipentaerythritol hydroxy pentaacrylate and activating radiation from an argon ion laser which had a wavelength of 514 nm. Typical photoinitiators that were used (the amount of each ingredient being given parenthetically following its name) and the depth to which the composition was polymerized by a 1 second exposure at 500 mW are given in the following table:

| Example | Photoinitiator System | | Depth of Polymerization |
|---|---|---|---|
| | Initiator (g/kg monomer) | Accelerator (g/kg monomer) | |
| 5 | Eosin lactone (0.080) | triethanolamine (17) | 3.497 |
| 6 | Ethyl eosin ester (0.084) | triethanolamine (18) | 4.822 |
| 7 | RB Lactone (0.104) | triethanolamine (18) | 4.941 |
| 8 | Ethyl RB (0.103) | triethanolamine (17) | 7.057 |
| 9 | RB Peroxide (0.12) | none | 6.077 |
| 10 | Eosin lactone (0.080) | Naphthalene peroxide | 2.358 (not reliable) |
| 11 | Erythrosin (0.084) | triethanolamine (17) | 4.855 |
| 12 | Methylene violet (0.045) | triethanolamine (17) | —[1] |
| 13 | Methylene violet (0.25) | triethanolamine (17) | 1.219 |
| 14 | Eosin lactone (0.08) | triethanolamine (18) | 3.497 |
| 15 | Eosin lactone (0.084) | triethanolamine (18) | 4.822 |
| 16 | Rose Bengal lactone (0.104) | triethanolamine (18) | 4.941 |
| 17 | Rose Bengal ethyl ester (0.103) | triethanolamine (17) | 7.057 |
| 18 | RB peroxide (0.12) | none | 6.077 |
| 19 | Eosin lactone (0.08) | naphthyl peroxide (0.833) | 2.358 (not reliable) |
| 20 | Erythrosin (0.084) | triethanolamine (17) | 4.855 |
| 21 | Methylene violet (0.04) | triethanolamine (17) | >0.05 second induction |
| 22 | Methylene violet (0.25) | triethanolamine (17) | 1.219 |

The monomer system composed of vinyl 2-pyrollidone and dipentaerythritol hydroxy penta acrylate (hereafter "Monomer 2") which was used as described above in connection with Examples 5-22 is available from Mead Imaging under the trade designation "DPHPA".

EXAMPLES 23-29

Several photopolymerizations have been carried out using various photoinitiator systems in 10 g Monomer 2 and activating radiation from a helium/neon laser which emitted light at 632 nm. Typical photoinitiators that were used (the amount of each ingredient being given parenthetically following its name) and the depth to which the composition was polymerized by a 1 second exposure at 500 mW are given in the following table:

| | Photoinitiator System | | |
|---|---|---|---|
| Example | Initiator (g/kg monomer) | Accelerator (g/kg monomer) | Depth of Polymerization |
| 23 | Methylene violet (0.046) | triethanolamine (19) | >1 second induction |
| 24 | Methylene violet (0.27) | triethanolamine (19) | 7.94 |
| 25 | Methylene blue (0.38) | triethanolamine (19) | >1 second induction |
| 26 | Methylene blue (0.44) | triethanolamine (19) | 5.94 |
| 27 | Thionin | triethanolamine (19) | does not work |
| 28 | Methylene green (0.038) | triethanolamine (18) | long induction time |
| 29 | Methylene green (0.337) | triethanolamine (18) | 3.76 |

It has been found that the depth of polymerization, when photopolymerizable compositions according to the instant invention are subjected to photon initiation of suitable, constant intensity, is directly proportional to log T, where T is the time of exposure, which is conveniently measured in seconds. As a consequence, the exposure time necessary to polymerize to any given depth, using any given intensity of photon initiation, can be calculated if the depth to which photon initiation of that intensity causes polymerization in a given time and the slope (S) of the straight line relationship between log time and depth are known. In fact, the equation is simple if depth (I) of polymerization at one second (log T=zero) is determined; the depth of polymerization (L) in mm then equals S times log T plus I. In the data for Examples 5-29 which is set forth in the foregoing tables, depth of polymerization is I; S is given in the following table for Examples 5-13 when the intensity of the activating radiation is 500 mW and for Examples 14-29 when the intensity is 100 mW (omitting data concerning inoperable compositions in both cases):

| Example No. | Slope |
|---|---|
| 5 | 3.653 |
| 6 | 5.639 |
| 7 | 5.473 |
| 8 | 4.600 |
| 9 | 5.821 |
| 10 | 4.297 |
| 11 | 5.093 |
| 13 | 7.535 |
| 14 | 3.653 |
| 15 | 5.639 |
| 16 | 5.473 |
| 17 | 4.60 |
| 18 | 5.821 |

-continued

| Example No. | Slope |
|---|---|
| 19 | 4.297 |
| 20 | 5.093 |
| 22 | 7.535 |
| 24 | 7.831 |
| 26 | 4.830 |
| 29 | 2.98 |

EXAMPLE 30

Several photopolymerizations have also been carried out using a monomer system composed of 12.1 g diacrylate of an ethoxylated-bisphenol and 12.1 g acrylic monomer, using an Ar(+) laser, wavelength 514 nm, intensity 500 mW. In one series of photopolymerizations the monomer composition also contained 0.02 g eosin Y lactone dissolved in 0.48 g 2-hydroxyethyl-methacrylate and 0.8 g triethanolamine. I was found to be 0.480 mm and S was found to be 3.26.

In a second series of photopolymerizations the monomer composition also contained 0.1 g eosin Y lactone dissolved in 0.4 g 2-hydroxyethylmethacrylate and 0.8 g triethanolamine. I was was found to be 0.450 mm and S was found to be 1.90.

The ethoxylatedbisphenol diacrylate used as described above in Example 30 is available from Sartomer Company under the trade designation SR349.

The acrylic monomer used as described above in Example 30 is available under the trade designation "NOVACURE C3700" from Radcure Company.

EXAMPLES 31 AND 32

Several photopolymerizations have also been carried out using various photoinitiator systems in 10 g Monomer 1 and activating radiation from an inexpensive diode laser which emitted light at 682 nm, 5 mW. Two of the photoinitiators that were used were methylene violet (0.13 g/kg monomer) and methylene blue (0.13 g/kg monomer) and, in each case, triethanolamine (1.25 g/kg monomer). The beam of the laser was unfocused, but a spot of polymer 2 mm wide by 5 mm deep at the center was formed in 0.5 second. The spot of polymer was progressively larger when the exposure time was increased to 2 seconds, 10 seconds and 25 seconds, demonstrating that the 682 nm, 5 mW laser can be used according to the method of the instant invention to initiate three dimensional photopolymerization.

EXAMPLE 33

A xanthene dye derivative for use according to the invention as an initiator in a polymerizable composition was produced from 42.00 g rose bengal (structure of FIG. 1 where X2, X4, X5 and X7 are iodo, Y2' is COONa, Y3', Y4', Y5' and Y6' are chloro, and R is Na; FIG. 1 shows the quinonoid form of the xanthene dyes, although some of them, e.g., fluorescein, can be isolated in the lactoid form) which was dissolved in 350 mL dimethyl formamide. The solution was refluxed under an argon blanket for about 16 hours, with stirring, and was then concentrated to 80 mL by distillation of dimethyl formamide. An addition of 200 mL hydrochloric acid containing 2 m per liter was then made to the concentrated solution, after which a pasty red solid was recovered by vacuum filtration. The red solid was washed with 500 mL of water and then with 300 mL of hexanes, and was dried for 48 hours under vacuum. The yield was 31.72 g decarboxylated rose bengal (structure of FIG. 1 where X2, X4, X5 and X7 are iodo, Y2' is H, Y3', Y4', Y5' and Y6' are chloro, M is O and R is Na), 82.63 percent of theory. The compound was identified by NMR and IR.

A 3.20 g portion of the decarboxylated rose bengal was dissolved in 20 mL acetyl chloride, and the solution was refluxed, with stirring, under an argon blanket for 36 hours, after which time the solution was found to be almost completely free of the starting dye. The solution was then concentrated under vacuum, leaving a dark red solid. A part of the solid was used in photopolymerization studies which are subsequently described herein, while another part was purified and identified by NMR and elemental analysis as O-acetyl decarboxylated rose bengal ("RBAX"; structure of FIG. 1 where X2, X4, X5 and X7 are iodo, Y2' is H, Y3', Y4', Y5' and Y6' are chloro, M is O and R is acetyl).

EXAMPLE 34

O-trichloroacetyl decarboxylated rose bengal (structure of FIG. 1 where X2, X4, X5 and X7 are iodo, Y2' is H, Y3', Y4', Y5' and Y6' are chloro, M is O, and R is trichloroacetyl) was produced from 5.24 g decarboxylated rose bengal prepared as described in Example 33, and dissolved in 20 mL trichloroacetyl chloride. The solution was refluxed under an argon blanket, with stirring, for forty hours, after which time the solution was found to be almost completely free of the starting dye. The solution was then concentrated under vacuum at about 80°, leaving a dark red solid, which was identified by NMR as O-trichloroacetyl decarboxylated rose bengal.

EXAMPLE 35

O-methyl decarboxylated rose bengal (structure of FIG. 1 where X2, X4, X5 and X7 are iodo, Y2' is H, Y3', Y4', Y5' and Y6' are chloro, M is O, and R is methyl) was produced from 1.17 g decarboxylated rose bengal produced as described in Example 33, 2.0 mL dimethyl sulfate, and 4.0 g sodium carbonate dissolved in 30 mL 1,2-dimethoxyethane. The solution was refluxed, with stirring, under an argon blanket for 5 hours and was cooled to room temperature of about 22°. Solids which formed were separated from the liquid by filtration and washed with 50 mL dichloromethane. The wash was combined with the filtrate and the resulting solution was concentrated under vacuum. The residue was placed on a 4 inch alumina column and eluted with 500 mL hexanes (fractions 1 and 2) and with 1,750 mL dichloromethane (fractions 3 through 9). The dichloromethane fractions were combined, and the resulting solution was concentrated under vacuum, leaving 0.92 g O-methyl decarboxylated rose bengal, which was identified by NMR and IR.

EXAMPLE 36

O-(3,5-dinitrobenzoyl) decarboxylated rose bengal (structure of FIG. 1 where X2, X4, X5 and X7 are iodo, Y2' is H, Y3', Y4', R5' and Y6' are chloro, M is O, and R is 3,5-dinitrobenzoyl) was produced from 3.00 g decarboxylated rose bengal produced as described in Example 33 and 0.88 g 3,5-dinitrobenzoyl chloride dissolved in 40 mL toluene. The solution was refluxed, with stirring, under a nitrogen atmosphere for 48 hours. O-(3,5-dinitrobenzoyl) decarboxylated rose bengal, which was identified by NMR, was recovered by concentrating the reaction mixture under vacuum.

EXAMPLE 37

O-acetyl ethyl eosin (structure of FIG. 1 where X2, X4, X5 and X7 are bromo, Y2' is —COOCH$_2$CH$_3$, Y3', Y4', Y5' and Y6' are H, M is O, and R is acetyl) was produced from a solution of 5.00 g ethyl eosin (structure of FIG. 1 where X2, X4, X5 and X7 are bromo, Y2' is —COOCH$_2$CH$_3$, Y3', Y4', Y5' and Y6' are H, M is O, and R is Na) in 30 mL acetyl chloride by refluxing the solution, with stirring, under an argon blanket for 36 hours and removing the excess acetyl chloride under vacuum. The product, an orange solid, was dried under vacuum at about 80° for 48 hours, and was identified by NMR.

EXAMPLE 38

Several polymerizations were carried out using RBAX produced as described above as an initiator for the polymerization of dipentaerythritol hydroxy penta-acrylate, triethanolamine as an accelerator, and activating radiation from an argon ion laser which had a wavelength of 514 nm. The composition polymerized was a solution which contained 20 percent of tetrahydrofuran in the dipenta-erythritol hydroxy penta-acrylate, and, per 1000 g of the solution, 0.0087 g RBAX and 0.19 g triethanolamine. The composition was placed in a quartz cuvette which had a square base 1 cm on a side and four sides at right angles to the base, each 1 cm by 4 cm, and several portions of the composition were exposed to light from the argon laser at a power of 100 mW in the manner described in Example 1. The unreacted solution was then decanted from the cuvette, and the lengths of spikes attached to the interior of the cuvette which had been formed by polymerization of the solution were measured. The lengths of the spikes at various exposure times are given in the following table:

| Spike Length (mm) | Time (Seconds) |
| --- | --- |
| 9.100 | 0.5000 |
| 8.006 | 0.2500 |
| 7.630 | 0.1250 |
| 4.340 | 0.0667 |
| no spike | 0.0333 |
| 2.980 | 0.0167 |

The procedure described above in Example 38 was repeated to polymerize a solution which contained 20 percent of tetrahydrofuran in the dipenta-erythritol hydroxy penta-acrylate, and, per 1000 g of the solution, 0.0090 g RBAX and 0.08 g triethanolamine. The lengths of the spikes at various exposure times are given in the following table:

| Spike Length (mm) | Time (Seconds) |
| --- | --- |
| 9.000 | 0.5000 |
| 7.590 | 0.2500 |
| 5.930 | 0.1250 |
| 4.050 | 0.0667 |
| 0.700 | 0.0333 |
| no spike | 0.0167 |

The procedure described above in Example 38 was also repeated to polymerize a solution which contained 20 percent of tetrahydrofuran in the dipenta-erythritol hydroxy penta-acrylate, and, per 1000 g of the solution, 0.0876 g RBAX and 0.16 g triethanolamine. The lengths of the spikes at various exposure times are given in the following table:

| Spike Length (mm) | Time (Seconds) |
| --- | --- |
| 2.204 | 0.5000 |
| 1.934 | 0.2500 |
| 1.476 | 0.1250 |
| 1.244 | 0.0667 |
| 1.140 | 0.0333 |
| 1.096 | 0.0167 |

The procedure described above in Example 38 was repeated, except that the wavelength of the radiation was 488 nm, to polymerize a solution which contained 20 percent of tetrahydrofuran in the dipenta-erythritol hydroxy penta-acrylate, and, per 1000 g of the solution, 0.07650 g RBAX and 0.09 g triethanolamine. The lengths of the spikes at various exposure times are given in the following table:

| Spike Length (mm) | Time (Seconds) |
| --- | --- |
| (Distorted) | 0.500 |
| 2.400 | 0.250 |
| 1.260 | 0.130 |
| 1.000 | 0.060 |
| 0.670 | 0.030 |
| Diffuse spike | 0.0167 |

Finally, the procedure described above in Example 38 was repeated to polymerize a solution which contained 20 percent of tetrahydrofuran in the dipenta-erythritol hydroxy penta-acrylate, and, per 1000 g of the solution, 0.04900 g RBAX and 0.40 g tetramethylammonium n-butyltriphenylborate. The lengths of the spikes at various exposure times are given in the following table:

| Spike Length (mm) | Time (Seconds) |
| --- | --- |
| 1.088 | 0.5000 |
| 0.943 | 0.2500 |
| 0.883 | 0.1250 |
| 0.745 | 0.0667 |
| 0.617 | 0.0333 |
| no spike | 0.0167 |

Examples 33 through 36 describe the decarboxylation of rose bengal to produce decarboxylated rose bengal and the production, from the latter, of RBAX, O-trichloroacetyl decaraboxylated rose bengal, O-methyl decarboxylated rose bengal and O-(3,5-dinitrobenzoyl) decarboxylated rose bengal. It will be appreciated that these reactions are general in the sense that equivalent amounts of other xanthene dyes, all compounds having the structure of FIG. 1 where Y2' is COONa, COOK, or the like and R is Na, K or the like, can be substituted for the rose bengal and decarboxylated by the method of the first paragraph of Example 33 to produce xanthene dye derivatives which are more soluble in polymerizable compositions than the parent dye. Examples of known xanthene dyes include rose bengal (the starting material in Example 33), fluorescein, eosin, phloxin, erythrosin, dichloro eosin (two compounds, one where Y3' and Y6' are Cl and one where X2 and X7 are Cl), dibromo fluorescein (two compounds, one where X4 and X5 are Br, and one where X2 and X7 are Br) and diiodofluorescein. Many other xanthene dyes are disclosed in the literature, commencing with Baeyer, A.(- Chemische Berichte, 1871, 4, 555 and 1875, 8, 146 and Annalen, 1880, 202) and continuing to the present (Hon, D.N.S. et al., Wood Sci. Techno, 1982, 16, 193; this paper is reference number 109 in a study that is about to be published). Accordingly, it will be appreciated that each of X2, X4, X5, X7, Y3', Y4', Y5', and Y6' in FIG. 1 can be H, Br, Cl, I, $NO_2$ or NR, where R has the meaning set forth below, that R can be an alkyl group having from 1 to 22 carbon atoms, an arlkaryl group having from 7 to 22 carbon atoms, an aryl group having from 6 to 20 carbon atoms, an aralkyl group having from 7 to 22 carbon atoms, a 2 to 10 membered carbocyclic or heterocyclic group, an olefinically unsaturated hydrocarbon group having from 2 to 10 carbon atoms, an acyl group having from 2 to 22 carbon atoms, or a halogenated acyl group having from 2 to 22 carbon atoms. Preferably, R is an alkyl group having from 1 to 4 carbon atoms, an acyl group having from 1 to 4 carbon atoms or a halogenated acyl group having from 1 to 4 carbon atoms. In FIG. 1, Y2' can be a group having the formula —COOR', where R' can be an alkyl group having from 1 to 22 carbon atoms, an aralkyl group having from 7 to 22 carbon atoms, an aryl group having from 6 to 20 carbon atoms, an aralkyl group having from 7 to 22 carbon atoms, a 2 to 10 membered carbocyclic or heterocyclic group, or an olefinically unsaturated hydrocarbon group having from 2 to 10 carbon atoms. Preferably, R' is an alkyl group other than t-butyl having from 1 to 4 carbon atoms. Similarly, in FIG. 1, M can be oxygen, sulfur, selenium, tellurium, $SO_2$, SO or NR', where R' has the meaning set forth above. Each of the foregoing compounds is either known or can be produced from known compounds by known chemical processes that will be apparent to one skilled in the art if requested to prepare that compound.

EXAMPLE 39

Figure 2:
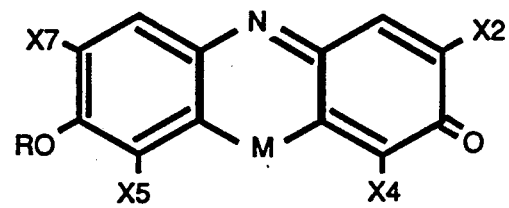
FIG. 2 is a structural formula for a family of derivatives of 7-hydroxy-3H-phenoxazin-3one, sodium salt ("resorufim") which are initiators in photopolymerizable compositions according to the invention.

The sodium salt of tetraiodoresorufim, a compound having the structure of FIG. 2 of the drawings where X1, X2, X3, and X4 are I, M is O, and R is Na was produced from a mixture of 1.0 g resorufim, 70 mL water, 21 mL saturated aqueous sodium carbonate and 4.84 g iodine. The iodine was added slowly to a mixture of the resorufim, water, and sodium carbonate solution, and the reaction mixture which resulted was stirred for about 16 hours at about 20°. The final reaction mixture, which contained the sodium salt of tetraiodoresorufim, was then acidified with concentrated hydrochloric acid; the precipitate which formed was recovered by filtration, washed with dilute hydrochloric acid, and dried under reduced pressure, yielding 1.2 g tetraiodoresorufim, which was identified by IR and NMR.

Tetraiodoresorufim acetate (the acetate of a compound having the structure of FIG. 2 of the drawings where X1, X2, X3, and X4 are I, and R is acetyl) was then produced by stirring a mixture of 500 mg tetraiodoresorufim produced as described in the preceding paragraph, 20 mg 4-dimethylaminopyridine, and 3 ml acetic anhydride in 40 ml dry tetrahydrofuran at about 20° for about 16 hours. The solvent was then removed from the reaction mixture under reduced pressure, and the residue which remained was dissolved in 100 mL diethyl ether. The ether solution was washed three times with 20 mL portions of dilute hydrochloric acid, three times with 20 mL portions of a 5 percent aqueous sodium bicarbonate solution and twice with 30 mL portions distilled water. The washed solution was then dried with magnesium sulfate and, after separation of the magnesium sulfate by filtration, concentrated, yielding 480 mg tetraiodoresorufim acetate.

EXAMPLE 40

Polymerizations were carried out using tetraiodoresorufim acetate produced as described above as an initiator for the polymerization of Monomer 1, n-butyltriphenyl cetylpyridinium borate as an accelerator, and activating radiation from an argon ion laser which had a wavelength of 514 nm. The composition polymerized was a solution of 8.7 mg tetraiodoresorufim acetate and 60.7 mg n-butyl-triphenyl cetylpyridinium borate in 10 mL Monomer 1. The polymerizations were carried out as described in Example 38. The weight of each of the polymer spikes that was formed when the composition was exposed to light from the argon laser at a power of 110 mW is given in the following table.

| | Exposure, seconds | | | | | |
|---|---|---|---|---|---|---|
| | 4 | 2 | 1 | ½ | ¼ | ⅛ |
| mg Polymer | 60.68 | 25.47 | 12.21 | 5.71 | 2.52 | 1.19 |

The weight of each of the polymer spikes that was formed when the composition was exposed to light from the argon laser at a power of 100 mW is given in the following table.

| | Exposure, seconds | | | |
|---|---|---|---|---|
| | 4 | 2 | 1 | ½ |
| mg Polymer | 61.66 | 32.30 | 15.03 | 1.30 |

Figure 3:
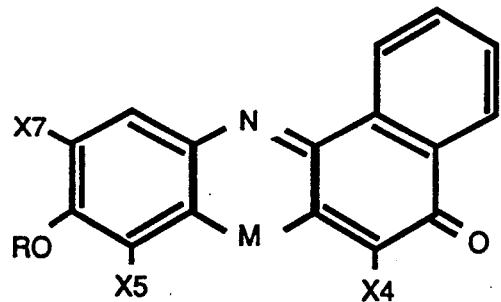
FIG. 3 is a structural formula for another family of resorufim derivatives which are initiators in photopolymerizable compositions according to the invention.
Figure 4:
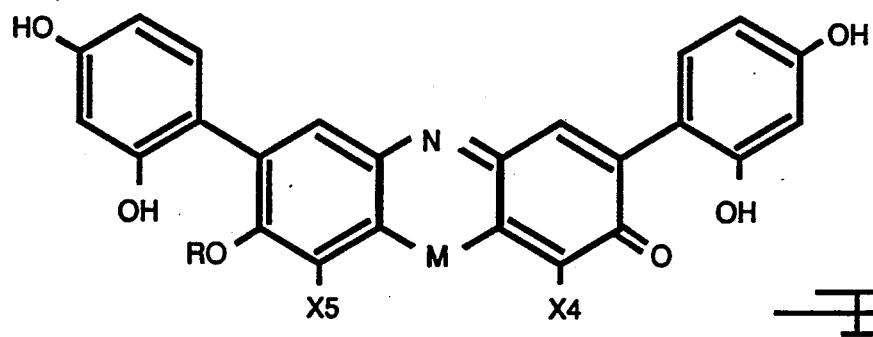
FIG. 4 is a structural formula for still another family of resorufim derivatives which are initiators in photopolymerizable compositions according to the invention.
Figure 5:
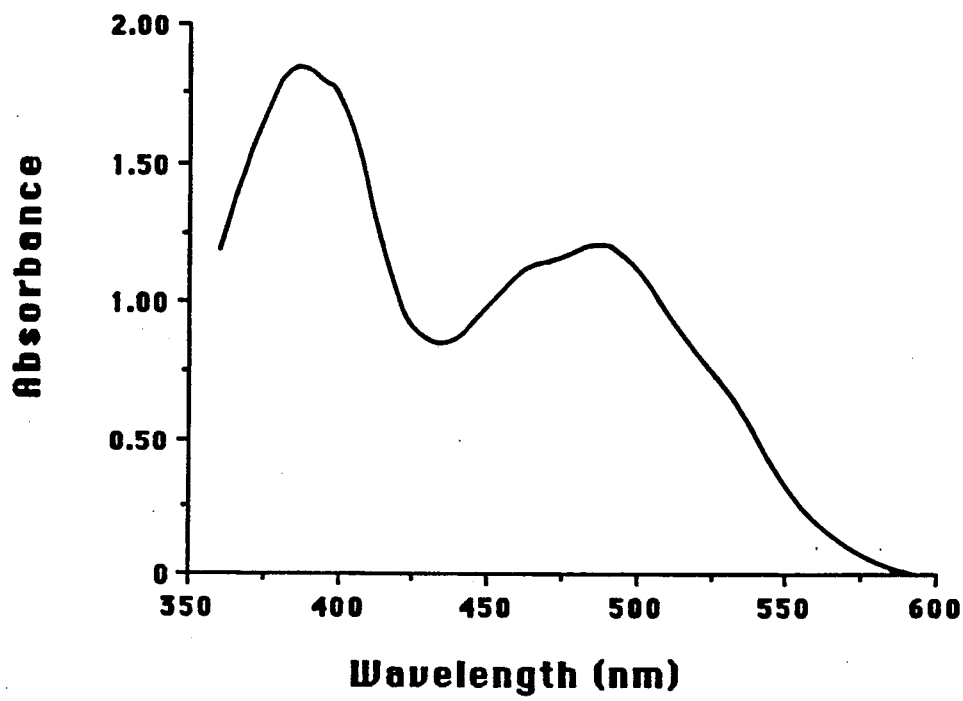
FIG. 5 is the absorption spectrum of an ethyl acetate solution of a photoinitiator according to the invention.

Tetrabromoresorufim and tetrachlororesorufim can be produced by bubbling bromine or chlorine through a stirred reaction mixture composed of resorufim, water and sodium carbonate, and other compounds having the structure of FIG. 2 can be produced by the method of Example 39 by substituting other starting materials for the resorufim. Lacmoid, a compound having the structure of FIG. 4 where X4, X5, and X7 are hydrogen and M is oxygen, is an example of another starting material that can be substituted for resorufim, as is a known compound having the structure of FIG. 3 where X4, X5 and X7 are hydrogen and M is oxygen. Compound having the structures of FIG. 2, FIG. 3 or FIG. 4 where each of X2, X4, X5 and X7 is H, Br, Cl, I, F, $NO_2$ or NR, where R has the meaning set forth below, M is oxygen, sulfur, selenium, tellurium, $SO_2$, SO or NR', where R is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group, an olefinically unsaturated hydrocarbon group having from 2 to 10 carbon atoms, an acyl group having from 2 to 22 carbon atoms, or a halogenated acyl group having from 2 to 22 carbon atoms can be produced from known compounds by known chemical processes that will be apparent to one skilled in the art if requested to prepare that compound, and can be used as photoinitiators in compositions and methods of the invention. Preferably, X2, X4, X5 and X7 are H, F, Cl, Br or I.

A photopolymerizable composition (hereafter "Photopolymerizable Composition 1") composed of 85 parts Monomer 1, 15 parts hexanedioldiacrylate, 0.0005 m per L RBAX and 0.008 m per L n-butyltriphenyl cetylpyridinium borate has been used by the method described in the 3-D Patent, and in apparatus furnished by the assignee of said patent, to produce articles having complex shapes, and, using a modification of that method and data from magnetic resonance imaging ("MRI") scans, to produce three dimensional models of the left ventricle of the heart of a living human. The modification of the method can also be used with computer accumulated tomographic X-ray scans ("CAT scans") or sonographic scans to produce three-dimensional models of the organs of living animals. The models can be of interior organs such as the heart, brain, pancreas, lung, throat, etc., or of fetuses, of bones, and the like. The following table is an example of the kind of data that is obtained from such a scan:

| | |
|---|---|
| 35 | 16.000000 |
| 60.031825 | 79.413209 |
| 58.327841 | 80.592867 |
| 56.329740 | 81.936523 |
| 54.597235 | 82.578459 |
| *** | |
| 60.031825 | 79.413209 |
| 35 | 16.201352 |
| 59.003664 | 79.218425 |
| 56.785309 | 80.758234 |
| 53.984738 | 81.091746 |
| *** | |
| 59.003664 | 79.218425 |

The entry "35 16.000000" means that, in a plane which is 16.000000 units above a reference point, MRI examination of a patient indicated that the organ being scanned had tissue of undefined thickness at each of 35 points identified by x and y coordinates listed below that entry (x and y coordinates for four such points are set forth above, that following the omission indicated "*" being the same as that for the first point). Similarly, the entry "35 16.201352" means that, in a plane which is 16.201352 units above the reference point, the MRI examination indicated that the organ had tissue of undefined thickness at each of 35 points identified by x and y coordinates listed below that entry (x and y coordinates for three such points are set forth above, that following the omission indicated "*" being the same as that for the first point). An actual MRI Scan would include data for the rest of the points in each of the planes identified above, and analogous data for some 250 additional planes at different numbers of units above the reference point. The data from the MRI Scan can be converted for input to a computer which has been programmed to control the vertical position of a horizontal platen with a circular surface about 90 cm in diameter and the location where a small diameter beam from an argon laser (514 nm) impinges on the platen. The 514 nm beam is directed horizontally onto a mirror from which it is reflected vertically downwardly onto the platen. A computer that has been used was programmed to direct the beam onto the center of the platen in response to the input of x and y coordinates of −1554 and 93. Accordingly, in converting the data from the MRI Scan, these coordinates were assigned to the first coordinates from the scan (60.031825[$x_1$], 79.413209 [$y_1$]), and the values of the other coordinates from the scan were calculated from these coordinates, using the following equations, where $x_n$ is the value of any subsequent x coordinate (rounded to four significant digits) from the Scan, $y_n$ is the value of the corresponding y coordinate (rounded to four significant digits) from the Scan, $X_n$ is the calculated value of the $X_n$ coordinate to be input to the computer, and $Y_n$ is the calculated value of the $Y_n$ coordinate to be input to the computer:

$$X_n = -1554 + 100(-60.03 + x_n)$$

$$Y_n = 93 + 100(-79.41 + y_n)$$

Values determined as described above for input to the computer corresponding, respectively, with the foregoing values from the MRI Scan, are set forth below:

| | |
|---|---|
| 35 | 1 |
| −1554 | 93 |
| −1724 | 211 |
| −1924 | 346 |
| −2151 | 410 |
| *** | |
| −1554 | 93 |
| 35 | 2 |
| −1657 | 74 |
| −1878 | 228 |
| −2159 | 261 |
| *** | |
| −1657 | 74 |

The model of the left ventricle of the heart of a living human was produced from actual MRI Scan data, converted as described above to give coordinates to which the computer had been programmed to respond. The model was produced from a quantity of Photopolymerizable Composition I contained in a glass beaker having a diameter of about 100 mm and a height of about 100 mm. The beaker was placed on a platform below the platen, and the vertical position of the platen was adjusted so that its top surface was about 0.2 mm below the surface of the Photopolymerizable Composition 1 in the beaker. The calculated data was input to the computer, and the computer program was then run, causing:

(1) the beam from the laser to shine vertically downwardly through the upper surface of the Photopolymerizable Composition 1 in the beaker toward the platen and to trace the curve defined by calculated points from −1554, 93 back to −1554, 93 that had been input to the computer;

(2) de-energizing of the laser;

(3) lowering of the platen substantially 0.22 mm farther below the surface of the Photopolymerizable Composition 1 in the beaker; and (4) repetition of steps (1), (2) and (3) to trace the curve defined by the second series of points from −1657, 74 back to −1657, 74 and by each subsequent series of points.

Although a specific example of the invention has been described with respect to an MRI Scan, it will be appreciated that CAT Scans, Sonographic Scans and scans from all other techniques which provide the required information could also be used.

As is stated above, the method of The 3-D Patent has been used with the indicated composition to make three-dimensional models of complex shapes such as turbines. Testing of the models that have been made indicates that the RBAX/n-butyl-triphenyl cetylpyridinium borate photoinitiator system was at least equivalent to the most effective such systems previously known, all of which require ultra violet radiation for activation, and significantly superior to all previously known photoinitiator systems that can be activated with visible light, such as the light from a laser.

Figure 6:
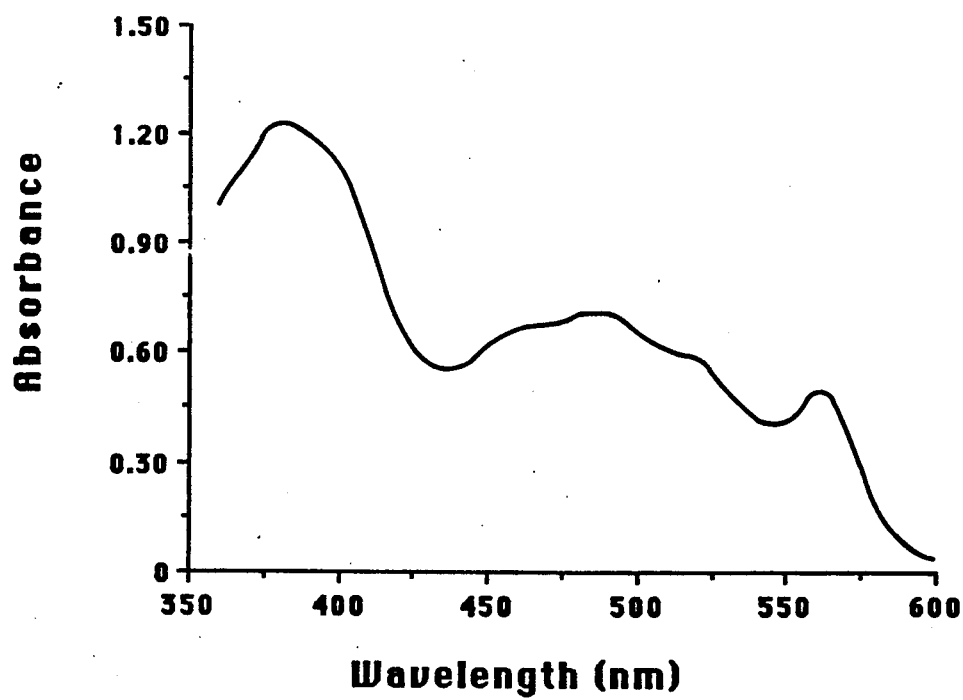
FIG. 6 is the absorption spectrum of the photoinitiator solution in ethyl acetate after irradiation thereof for 20 minutes at 514 nm.
Figure 7:
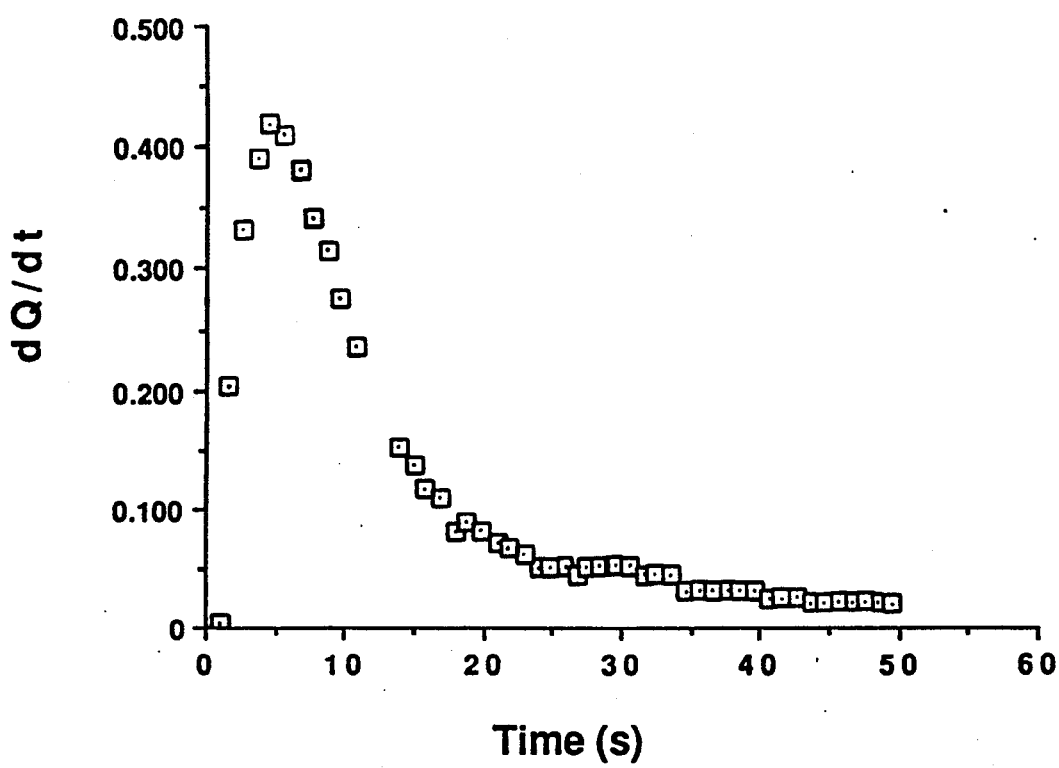
FIG. 7 is a plot against time of the rate of heat evolution during polymerization of a composition according to the invention.

Photopolymerizable Composition 1, the photoinitiator system thereof, and its RBAX component have been studied. The following abbreviations are used in describing the results of the studies: $R_p$ means rate of polymerization; RBAX (T) means RBAX triplet, which is believed to be formed upon photoreduction of RBAX by n-butyl-triphenyl cetylpyridinium borate; $\phi_T$ means quantum yield of RBAX (T) formation; $\phi_p$ means quantum yield of polymerization; $\phi_i$ means quantum yield of initiation; $I_o$ means intensity of incident light; $I_a$ means intensity of absorbed light, a chemical symbol within brackets ([]) means the concentration in moles per liter of the material in question, and M means the concentration in m per L of the relevant material, sometimes, for example, m per L carbon atoms joined by double bonds. Specifically, the photoreduction of RBAX by n-butyl-triphenyl cetylpyridinium borate and the absorption spectrum of RBAX have been determined. FIG. 6 of the attached drawings is the absorption spectrum of an ethyl acetate solution containing $1.19 \times 10^{-4}$ m per L RBAX, showing absorbance as a function of wavelength. The molar absorptivities at 384 nm and 486 nm were $1.03 \times 10^4$ (m per L)$^{-1}$ cm$^{-1}$ and $1.63 \times 10^4$ (m per L)$^{-1}$ cm$^{-1}$, respectively. The spectral shape and the molar absorptivities are similar to those reported for non-polar derivatives of rose bengal [see, for example, Lamberts, J. J. M. et al., *J. Am. Chem. Soc.*, 106 5879 (1984), Lamberts, J. J. M. et al., *J. Free Radicals in Biology & Medicine*, 1, 341 (1985) and Xu, D. et al., *J. Photochem.*, 38, 357 (1987)]. Irradiation of the solution for 20 minutes at 514 nm ($I_o = 1.26 \times 10^{-4}$ einsteins/L×s) did not change the absorption spectrum. Irradiation of an ethyl acetate solution containing $1.19 \times 10^{-4}$ m per L RBAX and $1.89 \times 10^{-3}$ m per L n-butyl-triphenyl cetylpyridinium borate caused bleaching of the RBAX and the appearance of an absorption peak at 560 nm, which corresponds with $\lambda_{max}$ for RBAX. FIG. 7 of the attached drawings is the absorption spectrum of the irradiated solution.

Figure 8:
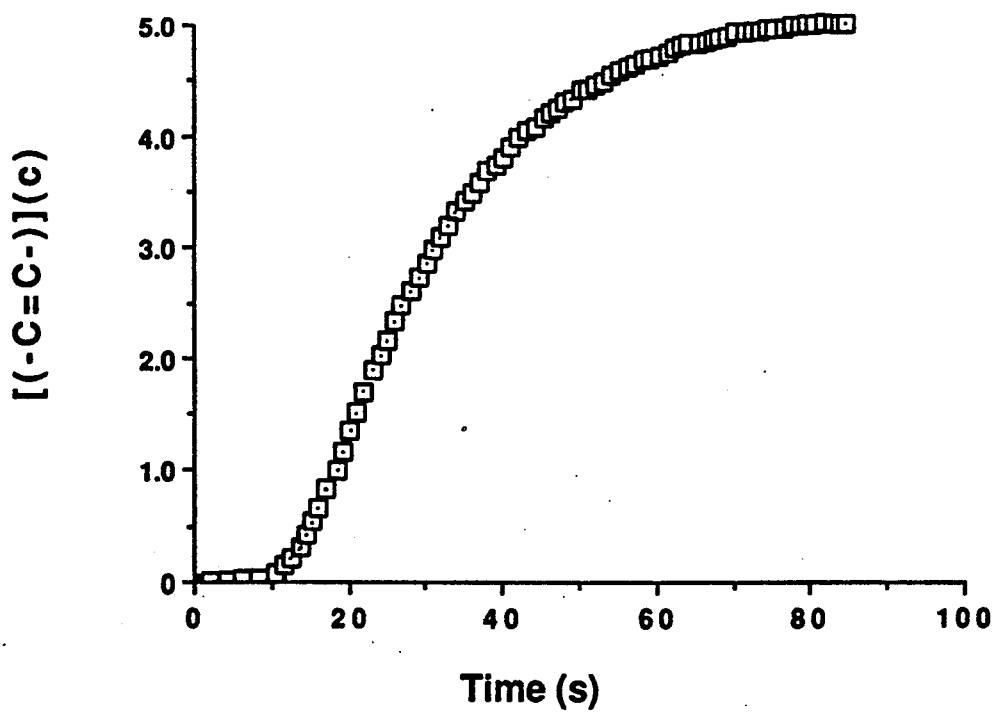
FIG. 8 is a plot against time of the double bonds consumed during polymerization of the composition according to the invention.

The rate of heat evolution when Polymerizable Composition 1 was photopolymerized was measured by thin foil photocalorimetry, using the method described by Hoyle, C. E. et al., *J. Appl. Poly. Sci.*, 33, 2985 (1987) and references cited therein. A sample of the composition was placed between glass cover slides which were spaced apart by about 25 μm by lens tissue. The Spectra Physics argon ion laser Model 2016-05, with its beam expanded to a circle having a diameter of 1.1 cm, was used to irradiate the monomer. FIG. 8 of the attached drawings is a plot of the rate of heat evolution (in arbitrary units) during the polymerization against time in seconds. The area under the curve is proportional to the number of double bonds reacted. Determinations of the area under curves for polymerizations at different light intensities and Bo⁻ concentrations indicate that the number of double bonds consumed is independent of the light intensity and of the Bo⁻ concentration. It was determined, by measuring the absorbance at 810 cm$^{-1}$ before and after irradiation, that the reaction gives a value for the maximum conversion of 45 percent, or 4.86M.

The following mechanism for photoreduction of RBAX by triphenyl n-butyl borate ion in ethyl acetate, is believed by the inventors to be consistent with all known data, and is proposed to assist those skilled in the art in understanding, but is not to be construed as limiting, the invention.

| RBAX | →RBAX (T) | $I_a \phi T$ |
|---|---|---|

-continued

| | | |
|---|---|---|
| RBAX (T) | →RBAX | $k_1$ |
| RBAX (T) + $O_2$ | →RBAX + $O_2$ | $k_2$ |
| RBAX (T) + $Bo^-$ | →RBAX + $Bo^-$ | $k_3$ |
| RBAX (T) + $Bo^-$ | →{RBAX · $^-$ n-bu.} | $k_4$ |
| {RBAX · $^-$ n-bu.} | →bleaching product | $k_5$ |
| {RBAX · $^-$ n-bu.} | →RBAX · $^-$ + n-bu. | $k_6$ |
| RBAX · $^-$ | →RB + Ac · | $k_7$ |

The parameters derived from the foregoing mechanism and rate constants measured by flash photolysis are set forth in the following table:

| Parameter | Value |
|---|---|
| $k_1$ | $2.78 \times 10^5 \text{ s}^{-1}$ |
| $k_1 + k_2[O_2]$ | $3.47 \times 10^6 \text{ s}^{-1}$ |
| $k_3 + k_4$ | $8.35 \times 10^8 \text{ M}^- \text{ s}^-$ |
| $k_7$ | $>4 \times 10^8 \text{ s}^{-1}$ |
| $k_5/k_6$ | $10.6 \pm 1.6$ |
| $\phi Tk_4/(k_3 + k_3)$ | $0.39 \pm 0.03$ |

Figure 9:
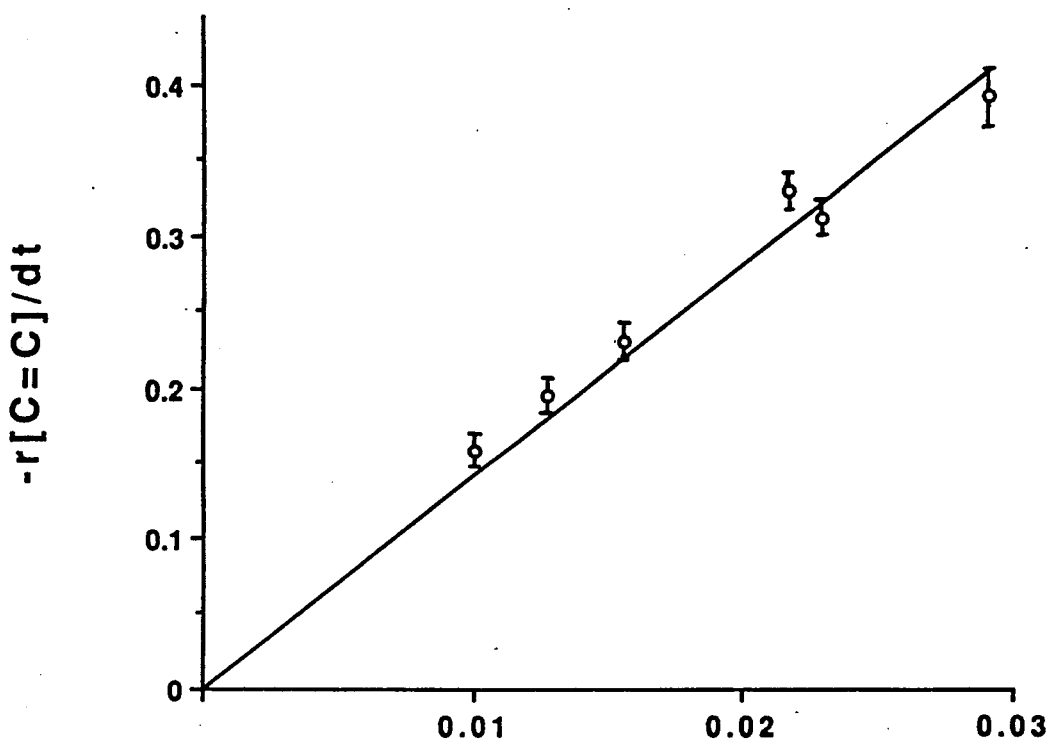
FIG. 9 is a plot against the square root of the absorbed light intensity of double bonds consumed during polymerization of the composition according to the invention.

FIG. 9 of the attached drawings is a plot of double bonds consumed as a function of irradiation time in seconds; the plot was constructed from the maximum conversion obtained, reported above. FIG. 9 indicates that the induction period obtained was 12.8 seconds. At a constant $Bo^-$ concentration of 10 mgm per L the reciprocal of the induction period increases linearly with the absorbed intensity ($I_a = 1-8 \times 10^{-4}$ einsteins/L×s), the slope of the line being $404 \pm 65$ L/einsteins. For an absorbed intensity of $6.86 \times 10^{-4}$ einsteins/L×s, the induction period is independent of the $Bo^-$ concentration. The average value is $3.4 \pm 0.6$ seconds for $[Bo^-] = 0.8-20$ mgm per L.

Figure 10:
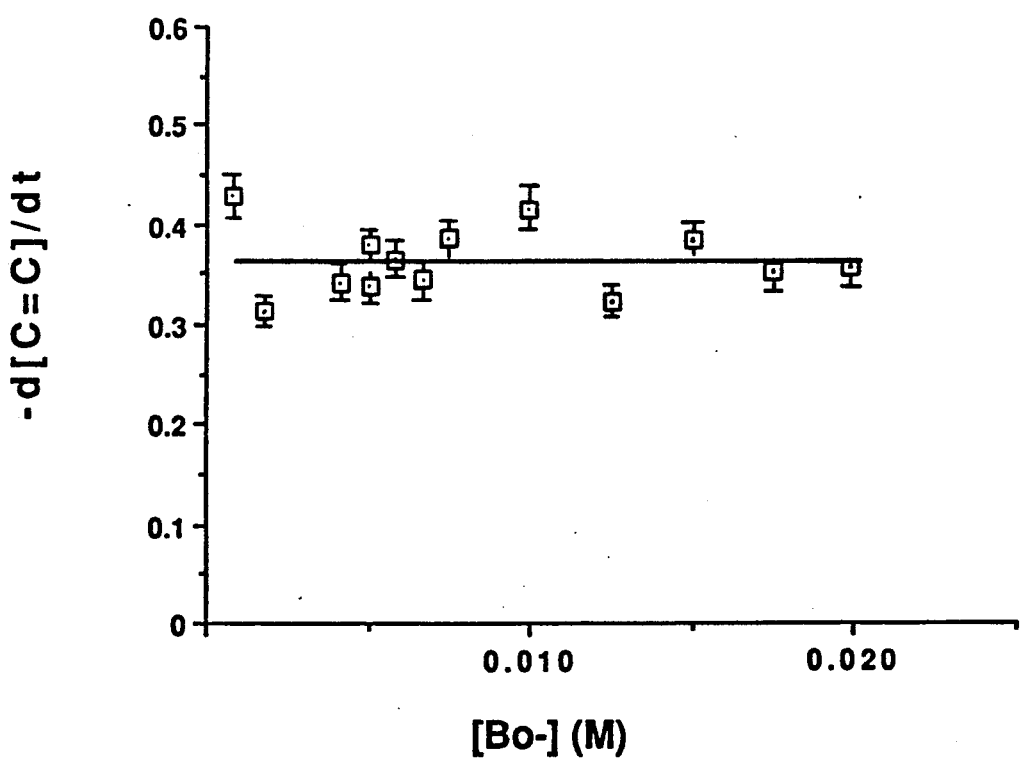
FIG. 10 is a plot of the first derivative with respect to time of double bonds consumed.

The initial rate of photopolymerization, calculated from FIG. 9, is 0.151 M/s. The order with respect to light intensity is one-half (see FIG. 10, which is a plot of the square root of the absorbed light intensity against the rate of consumption of double bonds). At constant intensity the rate of photopolymerization is independent of the $Bo^-$ concentration (see FIG. 11, which is a plot of the first derivative with respect to time of double bonds consumed as a function of $Bo^-$ concentration). It follows that the initial rate of photopolymerization is represented by the following equation:

$$R_p = [C=C]_o R_i^{0.5} k_p/k_t^{0.5}$$

where $[C=C]_o$ is the initial concentration of double bonds (10.8 m per L in Photopolymerizable Composition 1), $R_i$ is the rate of initiation, and $k_p$ and $k_t$ are the rate constants for propagation and bimolecular termination, respectively. The rate of initiation, which is equal to twice the rate of RB generation, is given by the following equation (see the foregoing mechanism for photoreduction of RBAX):

$$R_i = \alpha I_a \phi Tk_4[Bo^-]/(k_1 + k_2[O_2] + (k_3 + k_4)[Bo^-])$$

where $\alpha = (0.17 \pm 0.02)$.

Measurements of the lifetime of RBAX (T) in Photopolymerizable Composition 1 yield values of 3.2 μs and 1.6 μs in argon-saturated samples and in the presence of air, respectively. The results shown in FIG. 10 indicate that the photopolymerization order with respect to $Bo^-$ is zero, implying that $(k_3 + k_4)$ is greater than $3 \times 10^9 \text{M}^{-1}\text{s}^{-1}$. Because the rate constant calculated for a diffusion-controlled reaction (Murov, S. L., *Handbook of Photochemistry*, (1973), Marcel Dekker, Inc., New York, N.Y.) in the monomer formulation of Photopolymerizable Composition 1 is $1.7 \times 10^8 \text{M}^{-1}\text{s}^{-1}$, it is concluded that under these conditions, quenching of the RBAX excited state occurs, at least partially, by a static mechanism which does not require diffusion.

The quantum yield of photopolymerization and the kinetic chain length ($\phi_p/\phi_i$) both decrease with the square root of the absorbed light intensity. For the conditions shown in FIG. 9, the photopolymerization quantum yield is 1420. The quantum yield for radical generation is 0.067, giving a kinetic chain length of $2.1 \times 10^4$, which compares favorably with the value of $2.9 \times 10^4$ reported by Decker, C. et al., *T. Eur. Polym. J.*, 20, 753 (1984) for the UV photopolymerization of epoxy diacrylate/TMPTA in the presence of air. The following equation is derived from the slope of the curve of FIG. 10 by introducing the appropriate values in the equation for $R_p$:

$$k_p/k_t^{0.5} = 4.8 \pm 0.4 M^{-0.5} s^{-0.5}.$$

These parameters are summarized in the following Table, where $I_a = 1.06 \times 10^{-4}$ and "k.c.l." means kinetic chain length:

| Parameter | Value |
|---|---|
| $R_p$ | $(13.5 \pm 0.3) I_a^{0.5}$ |
| $\phi_p$ | $1420^{(a)}$ |
| $\phi_i$ | $0.067 \pm 0.009$ |
| k.c.l. | $(2.1 \pm 0.3) \times 10^4$ |
| $k_p/k_t^{0.5}$ | $4.8 \pm 0.4 \text{ M}^{-0.5}\text{s}^{-0.5}$ |

The value of $k_p/k_t^{0.5}$ for diallyl oxydiethylene dicarbonate (Bellobono et al., *Macromol. Rev.*, 15, (1980) 107) is $(1.5 \pm 0.2)$, while that obtained for dimethacrylates (Berlin, A. A. et al., *J. Polym. Sci. Macromol. Rev.*, 15, (1980) 107) ranges from 0.7 to $2.2 M^{-0.5} s^{-0.5}$. The higher value obtained for Polymerizable Composition 1 is indicative of faster propagation, slower termination, or both.

Photopolymerization of Photopolymerizable Composition 1 occurs by the conventional mechanism at low conversions. It has been stated in the literature (Decker et al., *J. Appl. Polym. Sci.*, 34, (1987) 1603 and cited references and Decker, C., "Materials for Microlithography: Radiation Sensitive Polymers", edited by Thompson, G. et al, *J. AACS Symp. Series* (1984), 208, 266) that this mechanism is not valid for the photopolymerization of multifunctional acrylates in the absence of solvent, where a linear variation of $R_p$ with light intensity is normally observed. However, half-order dependence on light intensity has been reported for the initial rate of UV photopolymerization in the diallyl oxydiethylene dicarbonate system (Bellobono et al., *Macromol. Rev.*, 15, (1980) 107), and it is the behavior reported to have been observed for the visible photopolymerization (at low conversions) of the multifunctional acrylates used in practicing the technology of such U.S. Patents as U.S. Pat. No. 4,772,541, granted Sep. 20, 1988 to Gottschalk et al., U.S. Pat. No. 4,788,125, granted Nov. 29, 1988 to Davis et al. and U.S. Pat. No. 4,713,312, granted Dec. 15, 1987 to Adair et al.

It will be appreciated that Photopolymerizable Composition 1 contains a new photoinitiator system based upon a neutral xanthene dye derivative and an external reducing agent; when the dye derivative is activated by radiation from a laser or other source (step I in the following chart), the dye derivative is activated (step II in the chart), electron transfer (oxidation reduction) occurs between the activated dye derivative and the reducing agent (step III), producing reduced dye derivative and oxidized reducing agent; both the oxidized reducing agent (IV) and the reduced dye derivative (V) are sources for radical fragments which cause polymerization. These phenomena are illustrated in the following chart:

(I) neutral xanthene dye derivative+external reducing agent+activating radiation→

(II) [neutral xanthene dye derivative]$^{++}$+external reducing agent→

(III) [neutral xanthene dye derivative]$^{-}$+[external reducing agent]$^{+}$ (IV) [external reducing agent]$^{+}$→[external reducing agent]$^{++}$+radicals (V) [neutral xanthene dye derivative]$^{-}$→[neutral xanthene dye derivative]$^{-}$+radicals (VI) [neutral xanthene dye derivative]$^{-}$→xanthene dye derivative+CH$_3$CO.

(VII) CH$_3$CO.+acrylate→polyacrylate

Previously known photoinitiators have been capable of causing the external reducing agent to form radicals (reaction (IV), above), but did not themselves form radicals which cause polymerization. Because the neutral xanthene dye derivative forms radicals which cause polymerization, the polymers have a kinetic chain length almost equal to those known for UV photoinitiators such as the benzoin ethers and ketone acetals. As is indicated by steps VI and VII, above, the radicals formed by RBAX which cause polymerization are free acetyl radicals which have an extra electron. Since the RBAX was produced by reacting acetyl chloride with decarboxylated rose bengal, it will be appreciated that other acyl chlorides, e.g., ones having the formula R'COCl where R' is an alkyl group, can be reacted with decarboxylated rose bengal to produce other photoinitiators which react similarly. It is usually preferred that R', in the foregoing formula have from 1 to 3 carbon atoms, but groups having many more carbons, up to, say, 22, should also be operable. These preferred photoinitiators have the structure of FIG. 1 of the attached drawings where R is R'(O=)C—, X2, X4, X5 and X7 Are iodo, Y2' is H, Y3', Y4', Y5' and Y6' are chloro and M is O. Preferred photoinitiators having the structure of FIG. 1 can also be prepared where Y2' is any nonionic group, R is R'(O=)C—, and each of X2, X4, X5, X7, Y3', Y4', Y5' and Y6' has the meaning set forth above. Preferred photoinitiators can also be produced from compounds having the structure of any of FIGS. 2 through 5 by reaction with acetyl chloride or another acyl chloride having the structure R'(O=)CCl to produce compounds wherein all RO and HO groups have been converted to R'(C=)C—O groups.

As has been explained above, when the photopolymerizable composition is composed of trimethylolpropane triacrylate, eosin lactone and triethanolamine, a beam of activating radiation, for example, from an argon ion laser having a wavelength of 514 nm, entering the composition causes the eosin to react with the triethanolamine, with the result that the dye color is lost, and two moieties are formed, one of which serves as an activator for the trimethylolpropane triacrylate; as a consequence of the loss of the dye color, subsequent radiation can penetrate deeper in the photopolymerizable composition. A similar mechanism is involved when the other photopolymerizable compositions specifically disclosed in the foregoing Examples are suitably activated. It will be appreciated, however, that other photopolymerizable compositions, in addition to those specifically disclosed, will react in a similar manner, and that such compositions can be used in practicing the three-dimensional polymerizing method of the instant invention, as can still other compositions, so long as they are ones in which an entering ray of activating radiation activates the photoinitiator system thereof at each of a succession of points, the first such point being immediately adjacent the surface through which the ray enters and subsequent points being successively farther from the surface in the direction of travel of the ray of activating radiation, the distance from the surface to the point of the succession farthest therefrom varying as a function of at least one of (a) the intensity of the activating radiation and (b) the time during which the activating radiation enters the body through the surface.

When the three-dimensional polymerizing method of the invention is practiced using a visible light photoinitiator such as eosin and its derivatives and visible light for activation, it is not necessary that the photoinitiator have a peak absorbance at the wavelength of the activating light; all that is required is that there be sufficient absorbance at the wavelength of the activating light to cause the reactions which form the activator and cause the dye to lose its color at the required rates. If bleaching occurs too rapidly, by comparison with the rate at which polymer forming radical formation occurs, radical reactions which do not cause polymerization, e.g., radical coupling, can be expected. On the other hand, if polymerization occurs too rapidly, by comparison with the rate at which bleaching occurs, activating light can not penetrate the monomer/photoinitiator mixture to a sufficient depth, and polymerization stops on or near the surface through which the light enters. This balance is achieved in the foregoing examples by selection of certain dyes as photoinitiators, using triethanolamine as an accelerator, and controlling the proportions of the two. In general, the photoinitiators are used at extremely low concentrations, by comparison with those which have previously been suggested and used, most frequently in curing thin films, for example of printing inks, solventless varnishes, adhesives or photoresists. The concentrations in which photoinitiators are used for thin film photopolymerizations are so high that activating light can not penetrate the monomer/photoinitiator mixture to a sufficient depth, and polymerization stops on or near the surface through which the light enters. On the other hand, as is shown by the data set forth above, the concentration of the photoinitiator must be sufficiently high that the induction period is not excessive, and the concentration of the activator and the photon density must both be sufficiently high that the rates of bleaching and polymerization are appropriately matched to achieve polymerization to a desired depth in a photopolymerizable composition.

The foregoing examples disclose several photopolymerizable compositions composed of a trimethylolpropane triacrylate monomer, a vinyl 2-pyrollidone and dipentaerythritol hydroxy penta acrylate monomer system, and a monomer system composed of a diacrylate of an ethoxylated-bisphenol and an acrylic monomer, one of several dyes which are photoinitiators and triethanolamine or another accelerator. Other monomers, photoinitiators and accelerators that can be used will be apparent to one skilled in the art from the foregoing disclosure. In general, the monomer should be one which has an electron starved double bond that is subject to addition polymerization, acrylic monomers, generally, being suitable. Similarly, other accelerators can be used, tertiary amines being preferred when visible light is used for activation and the photoinitiator is eosin lactone, methylene violet, methylene blue, methylene green or another photoinitiator which is a dye in the conventional sense. However, the invention can also be practiced with activating radiation that is outside the visible spectrum and a suitable activator, for example, one that, prior to activation is opaque to the activating radiation but, upon activation, undergoes a reaction which causes it to be transparent to the activating radiation. So far as the eye is concerned, bleaching is not associated with activation, but it does occur so far as the activating radiation is concerned. Indeed, all that is necessary is that the photopolymerizable composition be one wherein a ray of activating radiation which enters a body of the composition through a surface thereof activates the photoinitiator system and causes polymerization at each of a succession of points, the first such point being immediately adjacent the surface and subsequent points being successively farther from the surface in the direction of travel of the ray of activating radiation, and the distance from the surface to the point of the succession farthest therefrom varies as a function of at least one of (a) the intensity of the activating radiation and
(b) the time during which the activating radiation enters the body through the surface.

The invention is also a photohardenable composition comprising a free radical addition polymerizable or crosslinkable compound, a xanthene dye derivative and an electron donor. The xanthene dye derivative has a substituent in the 2' position which makes the derivative more soluble in the composition than the corresponding xanthene dye. The dye derivative is capable of absorbing visible light radiation and, as a consequence, of causing the electron donor to produce free radicals which initiate free radical polymerization or crosslinking of the composition. The electron donor is either not chemically reactive with the dye derivative, or reacts with the dye derivative sufficiently slowly that the electron donor produces free radicals to the extent required to initiate free radical polymerization or crosslinking of the composition. Preferably, the xanthene dye derivative is one which, when it absorbs visible light radiation, not only causes the electron donor to produce free radicals which initiate free radical polymerization or crosslinking of the composition, but also, itself, produces free radicals which initiate free radical polymerization or crosslinking. As is explained above, RBAX is an example of the latter kind of photoinitiator.

The method of the invention can also be used to produce a colored body. For example, a dye or pigment which imparts a color to a polymer produced from a body of the polymerizable composition can be to the body, and a polymer can be produced as previously described. The polymer can then be immersed in a body of another polymerizable composition containing another dye or pigment which imparts a different color to a polymer produced therefrom, and a second polymer can be produced. Finally, the composite polymer can be immersed in a body of a third polymerizable composition containing a dye or pigment which imparts a third color to a polymer produced therefrom, and a third polymer can be produced. It will be appreciated that the colors of the three polymers of the final composite can complement one another as colored printing inks complement one another in producing colored images.

The method of the invention can also be used in surgical procedures, for example to reconstruct a bone or to construct a hip. A photopolymerizable composition according to the invention can be positioned in any suitable way in the region where construction or reconstruction is required, and photopolymerization can be initiated by light of a suitable wavelength conducted to the polymer through optical fibers, the depth of polymerizatin being controlled by the duration of the activating light, the intensity, or both. Indeed, data concerning the reconstruction or construction can be input to a computer remote from the surgery, and the output from the computer can be used to control the activating light. The method can also be used to make a model of the reconstructed bone, hip or the like, and the model can be used to make a mold in which the required part is then produced in any suitable manner, e.g., by casting, by injection molding, by compression molding, or the like, as discussed in the 3-D patent.

Three dimensional objects can be made according to the method of the invention by positioning an appropriate laser and moving a body of the composition to be photopolymerized appropriately relative to the fixed laser. Indeed, the body of the composition to be polymerized can be moved either vertically or horizontally and then translated in the other direction; by repeating these movements radiation from the laser can be caused to enter the body in a complete two dimensional grid. The depth of polymerization can then be controlled by varying the rate of movement of the body, slower movement causing deeper polymerization, and vice versa. A similar result can be achieved by moving the laser rather than the body of the photopolymerizable composition.

By way of example, a relief map can be made by the method of the instant invention by directing a suitable laser upwardly through a bottom of a container and into a body of an appropriate photopolymerizable composition, moving the body of the polymerizable composition so that the laser enters the body in a complete two-dimensional grid, as described, and varying the rate of movement so that the depth of polymerization corresponds with the height to be represented at all points of the grid. The bottom of the container can be a material to which the polymer adheres, so that the relief map, when completed, is mounted on the bottom of the container as a base.

The method can also be used to weld two pieces, one of which is transparent to the radiation from the laser used, by confining a body of a photopolymerizable material in a region which includes that where the weld is desired, and then initiating photopolymerization with a laser to form the weld. Similarly, a spacer can be formed between two sheets, one of which is transparent to the radiation, by confining the body of the photopolymerizable material between the sheets, and then initiating photopolymerization with the laser to form the spacer. In a like manner, the edges of two sheets, one of which is transparent to the radiation, can be sealed and supported relative to one another by confining the body of the photopolymerizable material between the sheets, and then initiating photopolymerization with the laser to seal the edges and support them relative to one another.

It will be apparent that various changes and modifications can be made from the specific details of the invention as disclosed herein without departing from the spirit and scope thereof as defined in the appended claims.

We claim:

1. In a method for polymerizing a composition comprised of a photopolymerizable monomer and a photoinitiation system therefor, wherein a beam of activating radiation of a small diameter enters the composition at a point on the surface thereof and causes polymerization at said surface and at successive points removed from said surface in the direction of travel of said beam, and the depth from said point at said surface to the point of succession farthest therefrom over which polymerization occurs is a function of at least one of (a) the intensity of the activating radiation and (b) the time during which the activating radiation enters the composition at said point on said surface;

the improvement wherein said photoinitiator system includes a photoinitiator and an activator, said activator and said photoinitiator being present in sufficient amounts that said depth can be controlled by varying said intensity or said time, said photoinitiator being a compound which is bleached by exposure to said beam of activating radiation, and said method includes the step of varying the said intensity and/or said time said beam enters said composition at said point on the surface thereof such that said depth over which polymeration occurs is varied.

2. The method of claim 1 wherein said activator is triethanolamine.

3. The method of claim 2 wherein said photoinitiator is selected from the group consisting of eosin lactone, methylene violet, methylene blue, methylene green, ethyl eosin ester, Rose bengal lactone, ethyl Rose bengal, Rose bengal peroxide, and erythrosin.

4. The method of claim 1 wherein said method includes the step of varying said time and said depth of polymerization is directly proportional to the log of said time.

5. The method of claim 1 wherein said beam is a laser beam having wavelength between 400 and 1000 mn.

6. A method as claimed in claim 1 wherein the photoinitiator system includes a xanthene dye, a thionine dye, a cyanine dye, a styrillium ion dye, a pyrrilium salt dye, an oxazone dye, an azinium ion dye or a triphenylmethane dye.

7. A method as claimed in claim 6 wherein the photoinitiator includes a compound having the following structure

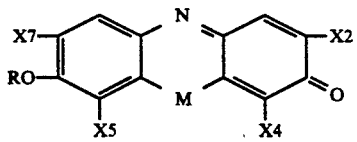

where each of X2, X4, X5 and X7 is hydrogen, halogen or NR2, where R is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group or an olefinically unsaturated hydrocarbon group having from 2 to 10 carbon atoms, and M is oxygen, sulfur, selenium, tellurium, SO2, SO or NR, and R is as defined above.

8. A method as claimed in claim 6 wherein the photoinitiator includes a compound having the following structure

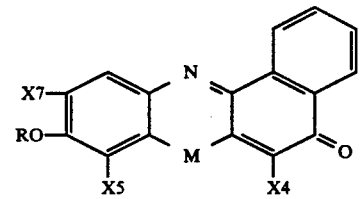

where each of X4, X5 and X7 is hydrogen, halogen or NR2, where R is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group or an olefinically unsaturated hydrocarbon group having from 2 to 10 carbon atoms, and M is oxygen, sulfur, selenium, tellurium, SO2, SO or NR, and R is as defined above.

9. A method as claimed in claim 6 wherein the photoinitiator includes a compound having the following structure

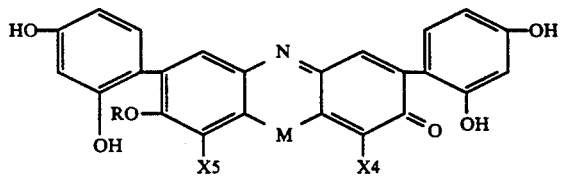

where each of X4 and X5 is hydrogen, halogen, or NH2, where R is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group or an olefinically unsaturated hydrocarbon group having from 2 to 10 carbon atoms, and M is oxygen, sulfur, selenium, tellurium, SO2, SO or NR, and R is as defined above.

10. A method as claimed in claim 6 where the dye is eosin lactone, methylene violet, methylene blue, methylene green, ethyl eosin ester, eosin B, RB lactone, ethyl RB, RB peroxide, eosin peroxide or erythrosin.

11. A method as claimed in claim 10 wherein the photoinitiator includes a xanthene dye derivative which has a substituent in the 2' position which makes the derivative more soluble in the composition than the corresponding xanthene dye.

12. A method as claimed in claim 11 wherein the xanthene dye derivative has H in the 2' position.

13. A method as claimed in claim 11 wherein the xanthene dye derivative has COOR' in the 2' position, where R' is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group or an olefinically unsaturate hydrocarbon group having from 2 to 10 carbon atoms.

14. A method as claimed in claim 11 wherein the xanthene dye derivative has the following structure

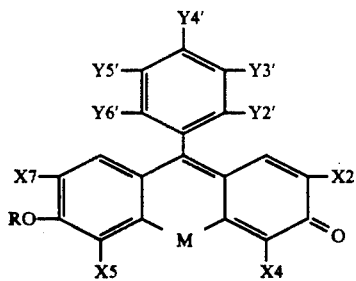

where Y2' is H or COOR, where R is an alkyl group having from 1 to 22 carbon atoms, an alkaryl group having from 7 to 22 carbon atoms, an aryl group having from 6 to 20 carbon atoms, an aralkyl group having from 7 to 22 carbon atoms, a 2 to 10 membered carbocyclic or heterocyclic group or an olefinically unsaturated hydrocarbon group having from 2 to 10 carbon atoms, R' is R, as defined above, an acyl group having from 2 to 22 carbon atoms, or a halogenated acyl group having from 2 to 22 carbon atoms, M is oxygen, sulfur, selenium, tellurium, $SO_2$, SO or NR, where R is as defined above, and each of X2, X4, X5, X7, Y3;, Y4', Y5' and Y6' is H, halogen, $NO_2$ or NR, where R has the meaning set forth above.

15. In a method for producing a three dimensional body wherein a layer corresponding to an XY plane through said body is exposed to a beam of activating radiation, said composition being comprised of a photopolymerizable monomer and a photoinitiator system therefor and wherein a beam of activating radiation of a small diameter enters said composition at a point on the surface thereof and causes polymerization at said surface and at a succession of points removed form said surface in the direction of travel of said beam, and the depth from said point at said surface to the point of succession farthest therefrom over which polymerization is caused is a function of at least one of (a) the intensity of the activating radiation and (b) the time during which the activating radiation enters the composition at said point on said surface;

the improvement wherein said photoinitiator system includes a photoinitiator and an activator, said activator and said photoinitiator being present in sufficient amounts that said depth of polymerization can be controlled by varying said intensity or said time, said photoinitiator being a compound which is bleached by exposure to said beam of activating radiation, and said method includes the step of varying said intensity and/or said time said beam enters said composition at said point on the surface thereof such that said depth over which polymeration occurs is varied.

16. The method of claim 15 wherein said method includes the step of varying said time and said depth of polymerization is directly proportional to the log of said time.

17. The method of claim 15 wherein said beam is a laser beam having a wavelength between 400 and 1000 mn.

* * * * *